(12) United States Patent
Lee et al.

(10) Patent No.: US 10,863,619 B2
(45) Date of Patent: Dec. 8, 2020

(54) DISPLAY APPARATUS AND ELECTRONIC DEVICE INCLUDING THE SAME

(71) Applicant: Samsung Display Co., Ltd., Yongin-Si (KR)

(72) Inventors: Kichang Lee, Gwacheon-si (KR); Myoung-ha Jeon, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 7 days.

(21) Appl. No.: 16/426,395

(22) Filed: May 30, 2019

(65) Prior Publication Data

US 2019/0373719 A1 Dec. 5, 2019

(30) Foreign Application Priority Data

Jun. 1, 2018 (KR) .................. 10-2018-0063362

(51) Int. Cl.
*H05K 1/00* (2006.01)
*H05K 1/02* (2006.01)
(Continued)

(52) U.S. Cl.
CPC ......... *H05K 1/0271* (2013.01); *H01L 27/323* (2013.01); *H01L 27/3244* (2013.01);
(Continued)

(58) Field of Classification Search
CPC .... H05K 1/0271; H05K 1/0277; H05K 1/111; H05K 1/0203; H05K 9/0054; H05K 2201/056; H05K 2201/10128; H05K 3/361; H05K 3/323; H01L 27/3244; H01L 27/323; H01L 51/5246; H01L 51/529; H01L 51/5284; H01L 51/5281; H01L 51/5253; H01L 51/5237; H01L 2251/5338

See application file for complete search history.

(56) References Cited

U.S. PATENT DOCUMENTS 9,326,375 B2 4/2016 Lee
9,349,969 B2 5/2016 Kwon et al.
(Continued)

FOREIGN PATENT DOCUMENTS

KR 10-2014-0122597 10/2014
KR 10-2015-0002118 1/2015
(Continued)

*Primary Examiner* — Yuriy Semenenko
(74) *Attorney, Agent, or Firm* — F. Chau & Associates, LLC

(57) ABSTRACT

A display apparatus includes a display panel including: a bending region having a curvature region and a facing region adjacent to the curvature region; and a non-bending region adjacent to the bending region and spaced apart from the facing region. The curvature region is disposed between the facing region and the non-bending region. The display apparatus further includes: a first protective member disposed in the non-bending region; a flexible circuit board connected to the display panel in the facing region; a stress relief member disposed in the curvature region; and an adhesive member disposed in the facing region. The adhesive member has a higher modulus of elasticity than that of the stress relief member and is coupled to the flexible circuit board.

21 Claims, 12 Drawing Sheets

(51) Int. Cl.
  *H01L 27/32* (2006.01)
  *H05K 1/11* (2006.01)
  *H01L 51/52* (2006.01)
  *H05K 9/00* (2006.01)

(52) U.S. Cl.
  CPC ........ *H01L 51/529* (2013.01); *H01L 51/5246* (2013.01); *H01L 51/5281* (2013.01); *H01L 51/5284* (2013.01); *H05K 1/0203* (2013.01); *H05K 1/0277* (2013.01); *H05K 1/111* (2013.01); *H01L 51/5253* (2013.01); *H05K 9/0054* (2013.01); *H05K 2201/056* (2013.01); *H05K 2201/10128* (2013.01)

(56) References Cited

U.S. PATENT DOCUMENTS

| | | |
|---|---|---|
| 9,673,423 B2 | 6/2017 | Lee et al. |
| 9,936,581 B1* | 4/2018 | Bergman ............... H05K 1/038 |
| 2014/0306941 A1* | 10/2014 | Kim .................... H04M 1/0268 345/204 |
| 2016/0205781 A1* | 7/2016 | Chan ...................... H05K 1/181 361/749 |
| 2016/0210894 A1* | 7/2016 | Lee ................... G02F 1/133305 |
| 2017/0278901 A1 | 9/2017 | Kim et al. |
| 2018/0027651 A1* | 1/2018 | Lim ....................... H01L 24/16 361/749 |
| 2018/0199426 A1* | 7/2018 | Lee ........................ H05K 1/028 |
| 2019/0148653 A1* | 5/2019 | Chen ...................... H01L 51/56 345/173 |
| 2020/0137900 A1* | 4/2020 | Park ......................... H05K 5/03 |

FOREIGN PATENT DOCUMENTS

| | | |
|---|---|---|
| KR | 10-1736930 | 5/2017 |
| KR | 10-2017-0102181 | 9/2017 |
| KR | 10-2017-0114223 | 10/2017 |
| KR | 10-1796813 | 11/2017 |

* cited by examiner

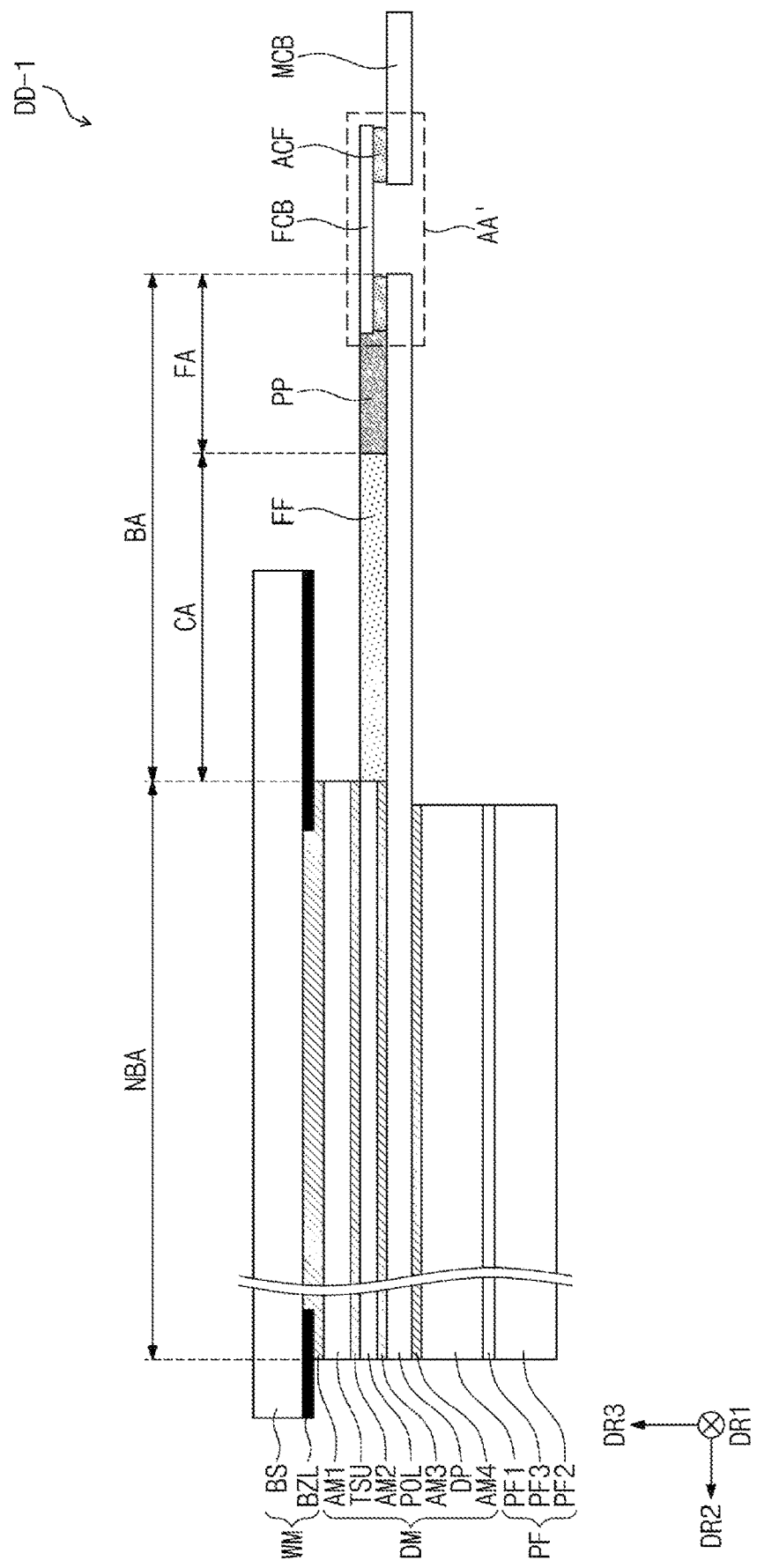

DISPLAY APPARATUS AND ELECTRONIC DEVICE INCLUDING THE SAME

CROSS-REFERENCE TO RELATED APPLICATION

This U.S. non-provisional patent application claims priority under 35 U.S.C. § 119 to Korean Patent Application No. 10-2018-0063362, filed on Jun. 1, 2018, the disclosure of which is incorporated by reference herein in its entirety.

TECHNICAL FIELD

The present invention relates to a display apparatus and an electronic device including the same, and more particularly to, a display module including an adhesive member and a stress relief member, and an electronic device including the same.

DISCUSSION OF THE RELATED ART

Electronic devices such as smart phones, tablets, notebook computers, and personal computers are being developed. Many electronic devices, such as the previously listed devices, are equipped with display apparatuses for displaying information. The electronic devices further include various electronic modules in addition to the display apparatuses.

An electronic device may include a display apparatus, which includes a portion that is bent to provide a slimmer bezel. During a process of bending a display apparatus, bending stress may be applied on the display apparatus and a defect may be produced.

SUMMARY

According to an exemplary embodiment of the present invention, a display apparatus includes a display panel including: a base substrate with an upper surface and a rear surface; a first pad disposed on the upper surface; a bending region having a curvature region and a facing region adjacent to the curvature region, wherein the curvature region is bendable about a bending axis extended along a first direction; and a non-bending region adjacent to the bending region and spaced apart from the facing region. The curvature region is disposed between the facing region and the non-bending region. The display apparatus further includes: a first protective member disposed in the non-bending region and on the rear surface of the base substrate; a flexible circuit board including a second pad connected to the first pad of the display panel in the icing region; a stress relief member disposed in the curvature region and on the upper surface of the base substrate; and an adhesive member disposed in the facing region and on the upper surface of the base substrate. The adhesive member has a higher modulus of elasticity than that of the stress relief member and is coupled to the flexible circuit board.

In an exemplary embodiment of the present invention, when the display panel is bent about the bending axis, the facing region overlaps the nonbending region, and the facing region of the display panel is coupled to the first protective member.

In an exemplary embodiment of the present invention, the display apparatus further includes second protective member disposed in the non-bending region. The second protective member seals an end of the display panel and is disposed on the flexible circuit board.

In an exemplary embodiment of the present invention, the display apparatus further includes an anisotropic conductive film disposed between the first pad and the second pad and connecting the first pad and the second pad.

In an exemplary embodiment of the present invention, the anisotropic conductive film extends toward the curvature region from the facing region, and is covered by the adhesive member.

In an exemplary embodiment of the present invention, a portion of the flexible circuit board is separated from the anisotropic conductive film, and the adhesive member is disposed between the portion of the flexible circuit board and the anisotropic conductive film.

In an exemplary embodiment of the present invention, the adhesive member exposes an upper surface of the flexible circuit hoard and is in contact with an end of the flexible circuit board. The flexible circuit board is bent from the upper surface of the base substrate.

In an exemplary embodiment of the present invention, the adhesive member is in contact with a portion of the upper surface of the flexible circuit board and an end of the flexible circuit board. The flexible circuit board is bent from the upper surface of the base substrate.

In an exemplary embodiment of the present invention, the first protective member includes a support layer, an impact absorbing layer, a heat dissipating layer or a light blocking layer.

In an exemplary embodiment of the present invention, the display apparatus further includes an anti-reflection member disposed on the display panel.

According to an exemplary embodiment of the present invention, an electronic device includes: a window member including a transmissive region, and a bezel region adjacent to the transmissive region; and a display panel including: pixels disposed under the window member and displaying an image in the transmissive region; a first pad connected to the pixels; a bending region including a curvature region and a facing region connected to the curvature region, wherein the curvature region is bendable about a bending axis extended along a first direction; and a non-bending region connected to the bending region and facing the facing region. In addition, the electronic device further includes: a flexible circuit board including a second pad connected to the first pad; a housing member including a bottom portion having a first surface and a connecting portion bent from the bottom portion, wherein the housing member accommodates the display panel and the flexible circuit board, when coupled to the window member; a stress relief member disposed in the curvature region; a first adhesive member disposed in the facing region and coupled to the flexible circuit board; and a second adhesive member disposed on the first surface of the bottom portion and coupled to the housing member and the flexible circuit board. The second adhesive member is coupled to a portion of the first adhesive member.

In an exemplary embodiment of the present invention, a modulus of elasticity of the first adhesive member is higher than that of the stress relief member.

In an exemplary embodiment of the present invention, the electronic device further includes an anisotropic conductive film disposed between the first pad and the second pad and connecting the first pad and the second pad.

In an exemplary embodiment of the present invention, the anisotropic conductive film extends toward the curvature region from the facing region and is covered by the first adhesive member, and the second adhesive member overlaps a portion of the anisotropic conductive film.

In an exemplary embodiment of the present invention, the electronic device further includes a space between a portion of the flexible circuit board and the anisotropic conductive film. The space is filled with the first adhesive member.

In an exemplary embodiment of the present invention, the first adhesive member is in contact with an end of the flexible circuit board and an end of the anisotropic conductive film.

In an exemplary embodiment of the present invention, the pixels include organic light emitting devices.

In an exemplary embodiment of the present invention, the electronic device further includes a protective member disposed on a lower portion of the display panel and disposed in the non-bending region. The protective member includes a support layer, an impact absorbing layer, a heat dissipating layer or a light blocking layer.

In an exemplary embodiment of the present invention, the electronic device further includes an input sensing unit disposed on the display panel and an anti-reflection member disposed on the input sensing unit.

In an exemplary embodiment of the present invention, the stress relief member includes a heat curable material or a light curable material.

According to an exemplary embodiment of the present invention, a display apparatus including: a display panel including a non-bending region and a bending region including a curvature region and a facing region adjacent to the curvature region. The curvature region is disposed between the non-bending region and the facing region. The display apparatus further includes: a protective member disposed on the display panel and in the non-bending region; a stress relief member disposed on the display panel and in the curvature region; a flexible circuit board electrically connected to the display panel in the facing region; and an adhesive member disposed on the display panel, in the facing region, and including a first end and a second end opposite the first end. The first end touches an end of the stress relief member and the second end touches an end of the flexible circuit board in the facing region.

BRIEF DESCRIPTION OF THE DRAWINGS

The above and other features of the present invention will become more apparent by describing in detail exemplary embodiments thereof, with reference to the accompanying drawings, in which:

FIG. 4A is a cross-sectional view of a display apparatus according to an exemplary embodiment of the present invention;

DETAILED DESCRIPTION OF THE EMBODIMENTS

Figure 1:
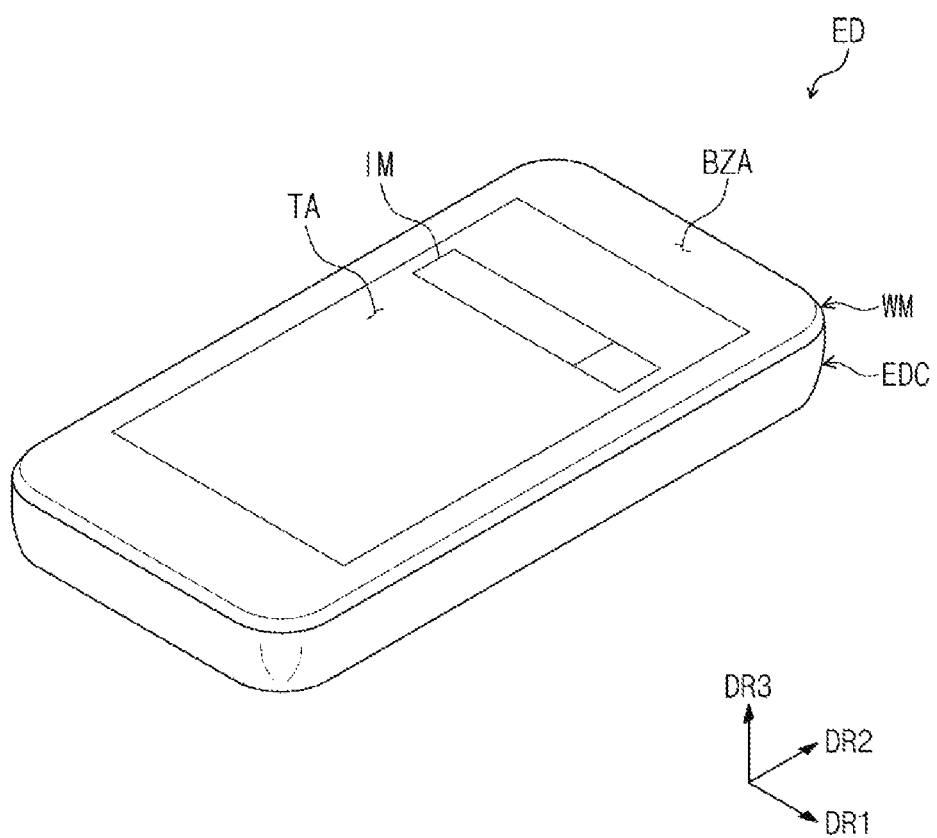
FIG. 1 is a perspective view of an electronic device according to an exemplary embodiment of the present invention.

Exemplary embodiments of the present invention will now be described more fully with reference to the accompanying drawings. It is to be understood that the present invention may be embodied in different forms and thus should not be construed as being limited to the exemplary embodiments set forth herein.

In the specification, it will be understood that when a layer, a film, a region, or a plate is referred to as being "on," another layer, film, region, or plate, it can be "directly on" the other layer, film, region, or plate, or one or more intervening layers, films, regions, or plates may be present.

in the drawings, like reference numerals may refer to like elements, and thus repetitive descriptions may be omitted. In the drawings, dimensions and sizes of elements may be exaggerated for clarity. Hereinafter, exemplary embodiments of the present invention will be described in detail with reference to the accompanying drawings.

Figure 2:
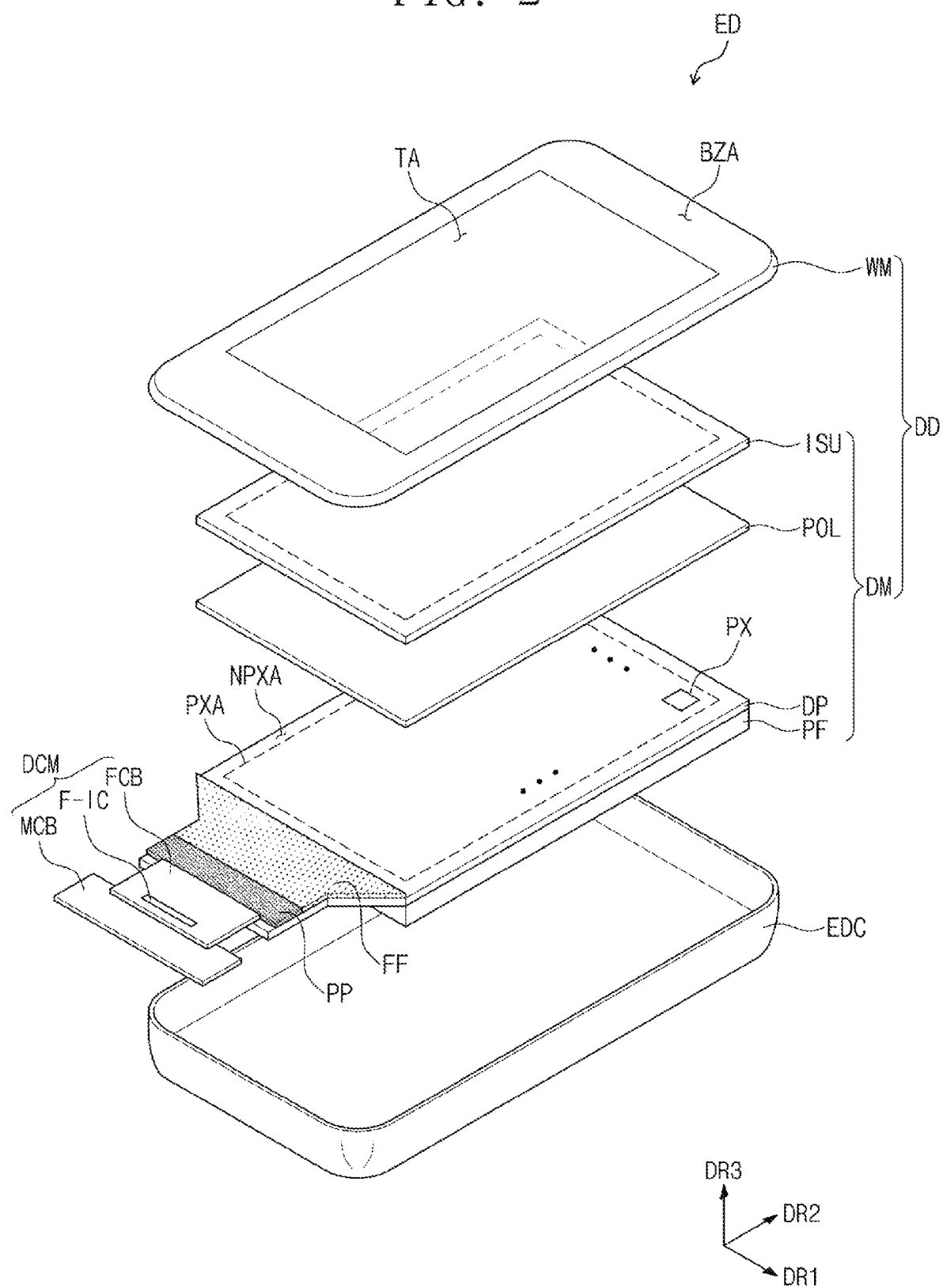
FIG. 2 is an exploded perspective view of a display apparatus according to an exemplary embodiment of the present invention.
Figure 3A:
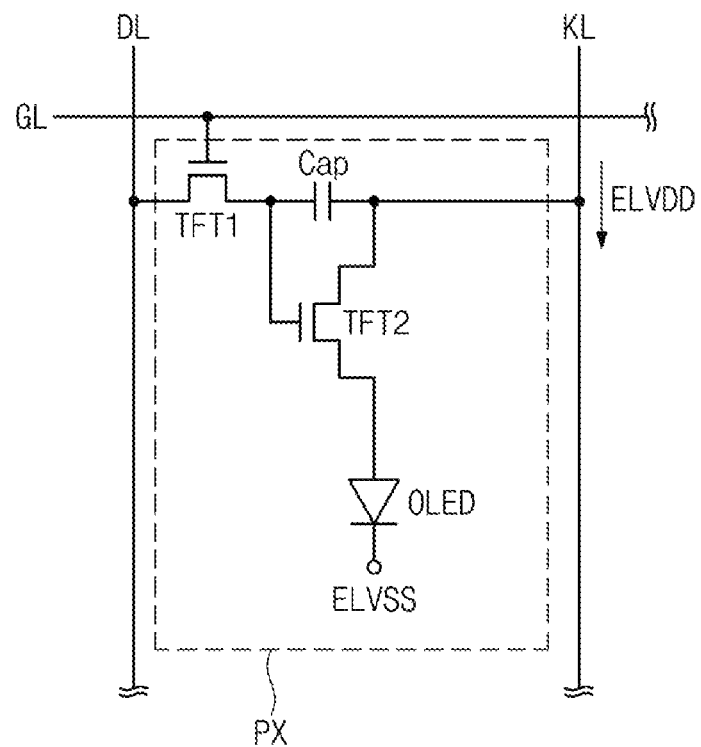
FIG. 3A is a circuit of one pixel of a display apparatus according to an exemplary embodiment of the present invention.
Figure 3B:
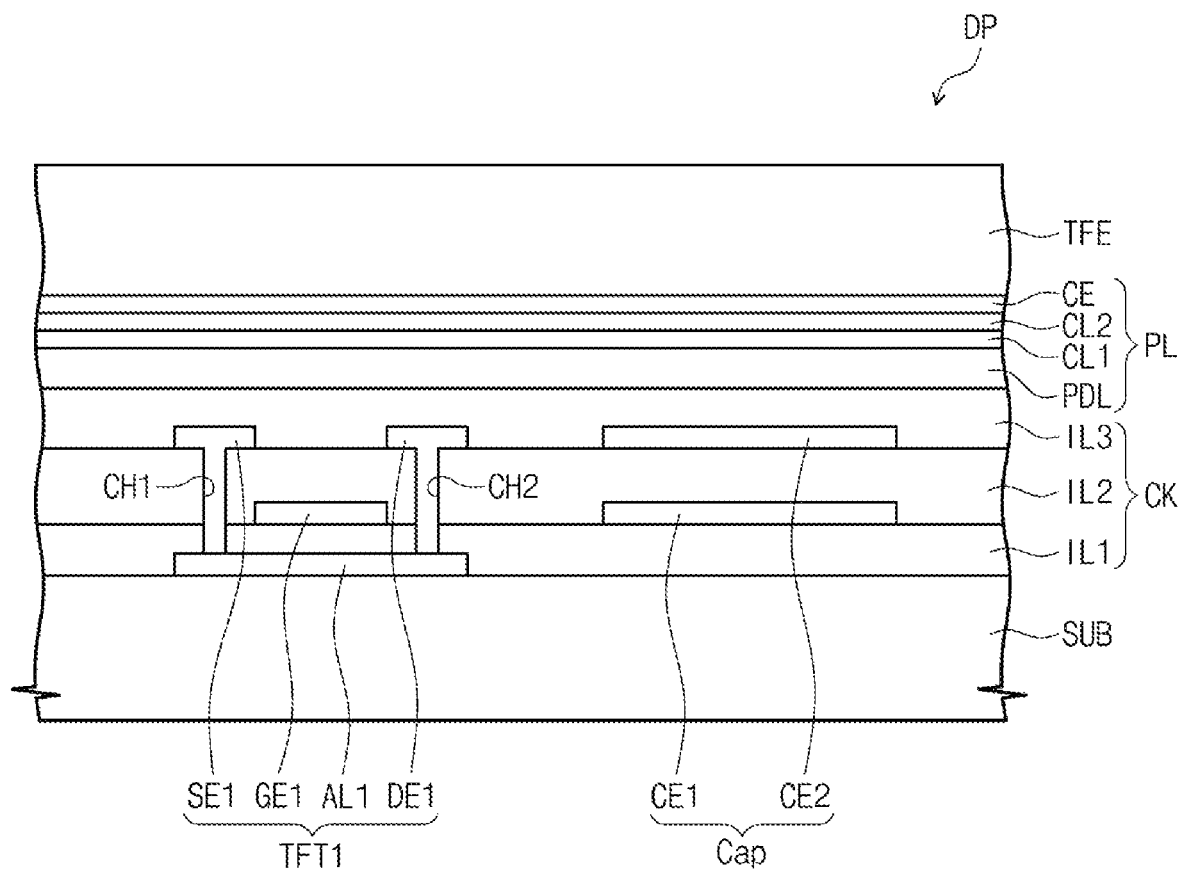
FIG. 3B and FIG. 3C are cross-sectional views showing a portion of a display apparatus according to an exemplary embodiment of the present invention.
Figure 3C:
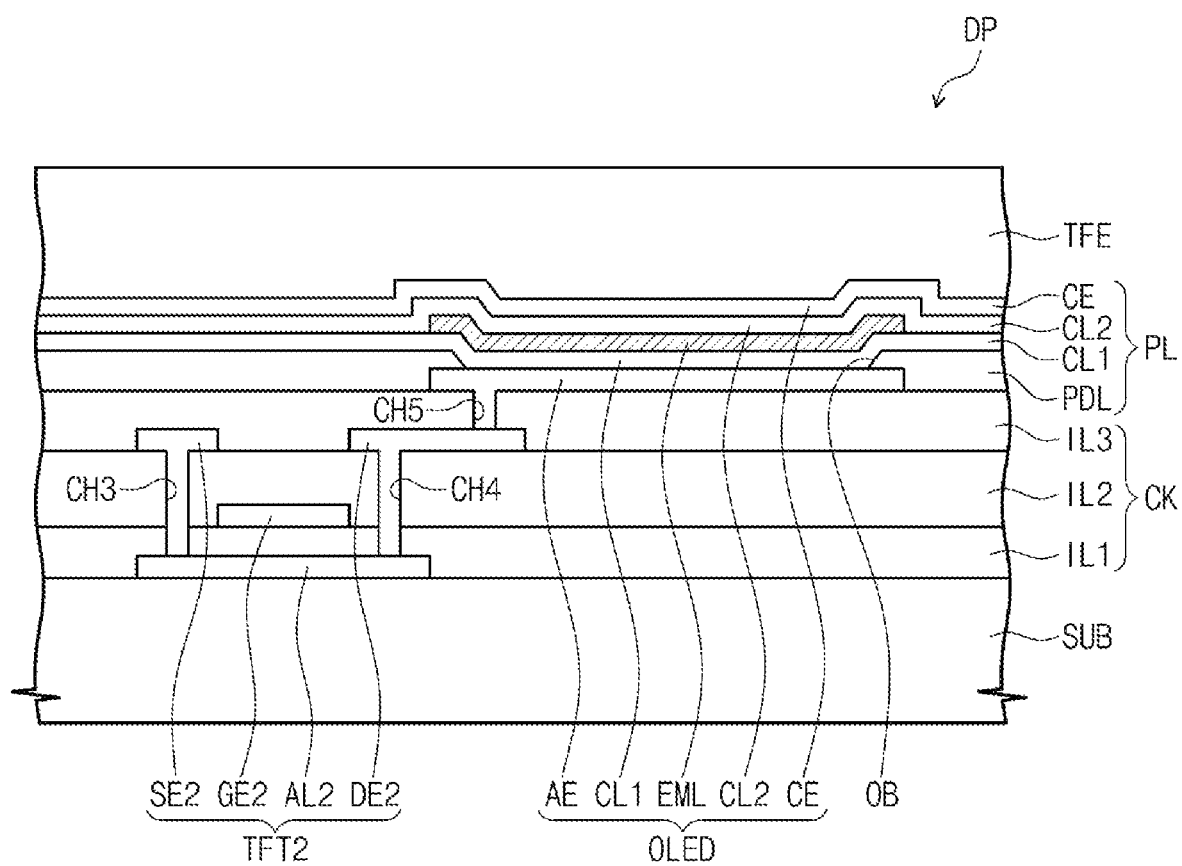

FIG. 1 is a perspective view of an electronic device according to an exemplary embodiment of the present invention. FIG. 2 is an exploded perspective view of a display apparatus according to an exemplary embodiment of the present invention. FIG. 3A is a circuit of one pixel of a display apparatus according to an exemplary embodiment of the present invention. FIG. 3B and FIG. 3C are cross-sectional views showing a portion of a display apparatus according to an exemplary embodiment of the present invention. Hereinafter, referring to FIG. 1 and FIG. 3C, an electronic device according to an exemplary embodiment of the present invention will be described.

In the present embodiment, a smart phone is shown as an example of an electronic device ED. However, the present invention is not limited thereto. In an exemplary embodiment of the present invention, the electronic device ED may be, for example, a tablet, a notebook computer, or a smart television. The electronic device ED may include a housing member EDC and a display apparatus DD.

Referring to FIG. 1, in the electronic device ED, a display surface on which an image IM is displayed extends in a first direction DR1 and a second direction DR2. The display surface includes a transmissive region TA and a bezel region BZA adjacent to the transmissive region TA. In FIG. 1, as an example of the image IM, a rectangular-shaped internet search window is shown. The bezel region BZA may at least partially surround the transmissive region TA. For example, the bezel region BZA may completely surround the transmissive region TA. However, the present invention is not limited thereto. For example, the bezel region BZA may be omitted. The normal direction of the display surface, for example, the thickness direction of the electronic device ED is indicated by a third direction DR3. For example, a front surface (e.g., an upper surface or a first surface) and a rear surface (e.g., a lower surface or a second surface) of an element may face each other in the third direction DR3.

The housing member EDC may be coupled to a display apparatus DD. The housing member EDC may provide an external surface of the electronic device ED. In the present embodiment, the housing member EDC is single structure. However, the housing member EDC may be formed from a plurality of members that are attached to each other. The housing member EDC may include a plurality of frames and/or plates including, for example, glass, plastic, and metal.

Referring to FIG. 2, the display apparatus DD may include a window member WM and a display module DM.

The window member WM includes a transparent member BS and a bezel layer BZL disposed on a rear surface of the transparent member BS. The bezel layer BZL may be disposed in the bezel region BZA. In the present embodiment, the window member WM having a flat shape and may overlap a display region of the electronic device ED. For example, the display region may be where an image is displayed from the display panel DP and may overlap the transmissive region TA. However, the shape of the window member WM may be modified. In addition, sides of the window member WM extending the first direction DR1 and the second direction D2 may have a curved surface.

The display module DM may include a display panel DP, an input sensing unit ISU, an anti-reflection member POL a protective member PF, a driving control unit DCM, a stress relief member FF, and an adhesive member PP. In FIG. 2, the display panel DP is in a flat state.

The display panel DP is a flexible display panel, and may be, for example, an organic light emitting display panel. The display panel DP is disposed between the window member WM and the protective member PF. The display panel DP includes a pixel region PXA on which a pixel PX is disposed and a non-pixel region NPXA adjacent to the pixel region PXA. For example, the non-pixel region NPXA may at least partially surround the pixel region PXA. In the non-pixel region NPXA, the pixel PX is not disposed therein, but other electrical components such as signal lines are disposed in the non-pixel region NPXA. The pixel region PXA and the non-pixel region NPXA may respectively correspond to the transmissive region TA (See, e.g., FIG. 1) and the bezel region BZA (See, e.g., FIG. 1). However, the present invention is not limited thereto. The regions that correspond to each may not be completely identical to each other (for example, shapes/areas and the like). For example, the pixel region PXA may be slightly smaller than the transmissive region TA.

The display panel DP may have a different width extending in the first direction DR1 depending on the region of the display panel DP. For example, in the display panel DP, a width of the pixel region PXA in the first direction DR1 may be different from a width of the non-pixel region NPXA in the first direction DR1. A width of a portion of the non-pixel region NPXA in the first direction DR1, the portion which is to be connected to the driving control unit DCM, may be smaller than a width of the pixel region PXA in the first direction DR1. A portion of the width of the non-pixel region NPXA, of which is changing along the first direction DR2, may correspond to a bending region BA shown in FIG. 4B. The display panel DP according to an exemplary embodiment of the present invention includes the display panel DP having different widths so that stress applied during bending may be dispersed, thereby facilitating bending.

FIG. 3A shows one pixel PX disposed on the pixel region PXA. The pixel PX receives gate signals from a gate line GL, and data signals from a data line DL. In addition, the pixel PX receives a first power voltage ELVDD from a power line KL. The pixel PX includes a first thin film device TFT1, a second thin film device TFT2, a capacitor Cap, and an organic light emitting device OLED.

In response to gate signals applied to the gate line GL, the first thin film device TFT1 outputs data signals applied to the data line DL. The capacitor Cap charges voltage corresponding to the data signals received from the first thin film device TFT1.

The second thin film device TFT2 is connected to the organic light emitting device OLED. The second thin film device TFT2 controls a driving current flowing in the organic light emitting device MED according to the quantity of charge stored in the capacitor Cap.

The organic light emitting device OLED includes an anode electrode AE connected to the second thin film device TFT2 and a cathode electrode CE for receiving a second power voltage ELVSS. The second power voltage ELVSS has a lower level than the first power voltage ELVDD.

As shown in FIG. 3B and FIG. 3C, the display panel DP includes a base substrate SUB, a circuit layer CK, and a display device layer PL. The circuit layer CK includes the first thin film device TFT1, the second thin film device TFT2, the capacitor Cap, and insulation layers IL1, IL2, and IL3. The display device layer PL includes a pixel defining film PDL and the organic light emitting device OLED.

The base substrate SUB includes, for example, a glass substrate, a metal substrate, and a flexible plastic substrate. A semiconductor pattern AL1 (hereinafter, a first semiconductor pattern) of the first thin film device TFT1, a semiconductor pattern AL2 (hereinafter, a second semiconductor pattern) of the second thin film device TFT2, and a first insulation layer IL1 are disposed on the base substrate SUB.

The first insulation layer IL1 covers the first semiconductor pattern AL1 and the second semiconductor pattern AL2. In addition, a first electrode CE1 of the capacitor Cap may be disposed on the first insulation layer IL1. A control electrode GE1 (hereinafter, a first control electrode) of the first thin film device TFT1, a control electrode GE2 (hereinafter, a second control electrode) of the second thin film device TFT2, and a second insulation layer IL2 are disposed on the first insulation layer IL1. The second insulation layer IL2 covers the first control electrode GE1 and the second control electrode GE2.

Each of the first insulation layer IL1 and the second insulation layer IL2 includes, for example, an organic film and/or an inorganic film. Each of the first insulation layer IL1 and the second insulation layer IL2 may include a plurality of thin films.

An input electrode SE1 (hereinafter, a first input electrode) and an output electrode DE1 (hereinafter, a first output electrode) of the first thin film device TFT1, and an input electrode SE2 (hereinafter, a second input electrode) and an output electrode DE2 (hereinafter, a second output electrode) of the second thin film device TFT2, and a third insulation layer IL3 are disposed on the second insulation layer IL2.

A second electrode CE2 of the capacitor Cap may be disposed on the second insulation layer IL2, The third insulation layer IL3 covers the first input electrode SE1, the first output electrode DE1, the second input electrode SE2, the second output electrode DE2, and the second electrode GE2.

The first input electrode SE1 and the first output electrode DE1 are connected to the first semiconductor pattern AL1 respectively through a first through-hole CH1 and a second through-hole CH2 which penetrate the second insulation layer IL2 and the third insulation layer IL3. In the same manner, the second input electrode SE2 and the second output electrode DE2 are connected to the second semiconductor pattern AL2 respectively through a third through-hole CH3 and a fourth through-hole CH4 which penetrate the second insulation layer IL2 and the third insulation layer IL3.

The organic light emitting device OLED and the pixel defining film PDL are disposed on the third insulation layer IL3. The pixel defining films PDL exposes a region of the third insulation layer IL3, and the organic light emitting device OLED overlaps the exposed region of the third insulation layer IL3. The pixel defining film PDL may correspond to a light emitting region.

The organic light emitting device OLED includes a first electrode AE, a light emitting pattern EML, a second electrode CE, a first charge control layer CL1 (or a first common layer) disposed between the first electrode AE and the light emitting pattern EML, and a second charge control layer CL2 (or a second common layer) disposed between the light emitting pattern EML and the second electrode CE.

According to an exemplary embodiment of the present invention, each of the first electrode AE, the first charge control layer CL1, the second electrode CE, and the second charge control layer CL2 may correspond to an anode electrode AE, a hole transport region CL1, an electron transport region CL2, and the cathode electrode CE, respectively.

The pixel defining film PDL is disposed on the anode electrode AL. The pixel defining film PDL exposes at least a portion of the anode electrode AE. In addition, the anode electrode AE is connected to the second output electrode DE2 through a fifth through-hole CH5 penetrating the third insulation layer IL3.

The hole transport region CL1 is disposed on the anode electrode AE and covers the anode electrode AE and the pixel defining film PDL. The hole transport region CL1 may include at least one of a hole injection layer, a hole transport layer or a single layer having both a hole injection function and a hole transport function.

The light emitting pattern EML is disposed on the hole transport region CL1. The light emitting pattern EML is provided in plurality and overlaps each light emitting region. The light emitting pattern EML may include, for example, a fluorescent material or a phosphorescent material. The light emitting pattern EML may generate light having one color, or light having at least two mixed colors.

The electron transport region CL2 is disposed on the light emitting pattern EML and covers the light emitting pattern EML and the hole transport region CL1. The electron transport region CL2 may include at least one of, for example, an electron transport material or an electron injection material. The electron transport region CL2 may be an electron transport layer including the electron transport material, or an electron injection/transport single layer including the electron injection material.

The cathode electrode CE is disposed on the electron transport region CL2 and faces the anode electrode AE. The cathode electrode CE may be composed of a material having a low work function so that injection of electrons is facilitated.

The cathode electrode CE and the anode electrode AE may be composed of different materials according to a light emitting method. For example, when the pixel region PXA according to an exemplary embodiment of the present invention is a front light emitting type, the cathode electrode CE may be a transmissive electrode, and the anode electrode AE may be a reflective electrode.

In addition, for example, when the pixel region PXA according to an exemplary embodiment of the present invention is a rear light emitting type, the cathode electrode CE may be a reflective electrode, and the anode electrode AE may be a transmissive electrode. The pixel region PXA according to an exemplary embodiment of the present invention may include the organic light emitting device OLED having various structures, but the present invention is not limited to a light emitting method.

A thin film encapsulating layer TFE is disposed on the cathode electrode CE. The thin film encapsulating layer TFE may seal the organic light emitting device layer OLED by covering the surface of the cathode electrode CE. For example, the thin film encapsulating layer TFE may cover the entire surface of the cathode electrode CE.

The thin film encapsulating layer TFE may include a plurality of inorganic films. Each of the inorganic films may include at least one of, for example, silicon nitride or silicon oxide. In addition, the thin film encapsulating layer TFE may further include another functional layer disposed among the inorganic films.

The input sensing unit ISU is disposed on the display panel DP. The input sensing unit ISU may obtain coordinate information of an external input. The input sensing unit ISU may sense various types of inputs provided from the outside of the electronic device ED. For example, the input sensing unit ISU may sense an input by a user's body, and recognize various types of external inputs such as light, heat, and/or pressure. In addition, the input sensing unit ISU may sense not only an input which is in contact with a surface of the input sensing unit ISU but also an input which is close to the surface of the input sensing unit ISU.

The anti-reflection member POL may be disposed between the display panel DP and the window member WM. The anti-reflection member POL may include a color filter, a polarizing film and/or a phase delay film. For example, when the anti-reflection member POL is a polarizing film, the anti-reflection member POL polarizes light provided from the display panel DP. For example, when the anti-reflection member POL is a phase delay film, the number of phase delay films and the length of phase delay films may be determined depending on the operating principle of the anti-reflection member POL.

In the present embodiment, the anti-reflection member POL and the input sensing unit ISU are shown to be provided separately. However, the present invention is not limited thereto. For example, at least one of the anti-reflection member POL or the input sensing unit ISU may be omitted. In addition, at least one of the anti-reflection member POL or the input sensing unit ISU may be directly formed on the display panel DP through a deposition process and the like.

The protective member PF may be disposed on a lower portion of the display panel DP. For example, the protective member PF member may be disposed on a bottom surface of the display panel DP. The protective member PF may include functional layers which may assist in driving of the display panel DP. For example, the protective member PF may include at least one of a support layer, an impact absorbing layer, a heat dissipating layer or a light blocking layer.

The driving control unit DCM is disposed on the non-pixel region NPXA of the display panel DR. The driving control unit DCM may include a main circuit board MCB (or a driving circuit board), a flexible circuit board FCB for connecting the main circuit board MCB and the display panel DP to each other, and a driving chip F-IC mounted on the flexible circuit board FCB. The driving chip F-IC may be mounted on the flexible circuit board FCB in the form of a COF (Chip On Film). The driving chip F-IC may include driving devices and circuits for driving the pixel PX.

A plurality of passive devices and active devices may be mounted on the main circuit board MCB. The main circuit board MCB may be a rigid circuit board or a flexible circuit board, and the flexible circuit board FCB may be a flexible circuit board. In addition, according to an exemplary embodiment of the present invention, the flexible circuit board FCB may be omitted, and the main circuit board MCB may be directly connected to the display panel DR. However, the electronic device ED according to an exemplary embodiment of the present invention is not limited thereto.

In addition, the connection between the main circuit board MCB and the flexible circuit board FCB, and the connection between the flexible circuit board FCB and the display panel DP may be achieved by pads disposed between the main circuit board MCB and the flexible circuit board FCB and between the flexible circuit board FCB and the display panel DP. Accordingly, the main circuit board MCB and the driving chip F-IC may be electrically connected to the circuit layer CK and the display device layer PL. The electrical connection may be achieved through a plurality of signal lines disposed on the display panel DP. The signal lines may include at least one of the gate line GL, the data line DL or the power line KL which are described above.

The stress relief member FF may be disposed in a region of the display panel DP, and the region of the display panel DP may have a width that gradually reduces. The stress relief member FF may have a shape that corresponds to the region of the display panel DP. For example, the region in which the stress relief member FF is disposed in may have a tapered shape, and the stress relief member FF may have a tapered shape. The adhesive member PP may be disposed between the stress relief member FF and the driving control unit DCM. The adhesive member PP according to the present invention may expose an upper surface of the display panel DP and may be in contact with an end of the flexible circuit board FCB disposed on the exposed upper surface of the display panel DP. For example, the flexible circuit board FCB may extend from the upper surface of the display panel DP and may be bent.

The stress relief member FF and the adhesive member PP may include an organic material. The stress relief member FF includes a synthetic resin. For example, the stress relief member FF may include at least one of acrylonitrile butadiene styrene copolymer (ABS), urebaneacrylate (UA), polyurethane (PU), polyethylene (PE), ethylene vinyl acetate (EVA) or polyvinyl chloride (PVC). For example, the stress relief member FF may include at least one of a heat curable material or a light curable material.

Figure 4B:
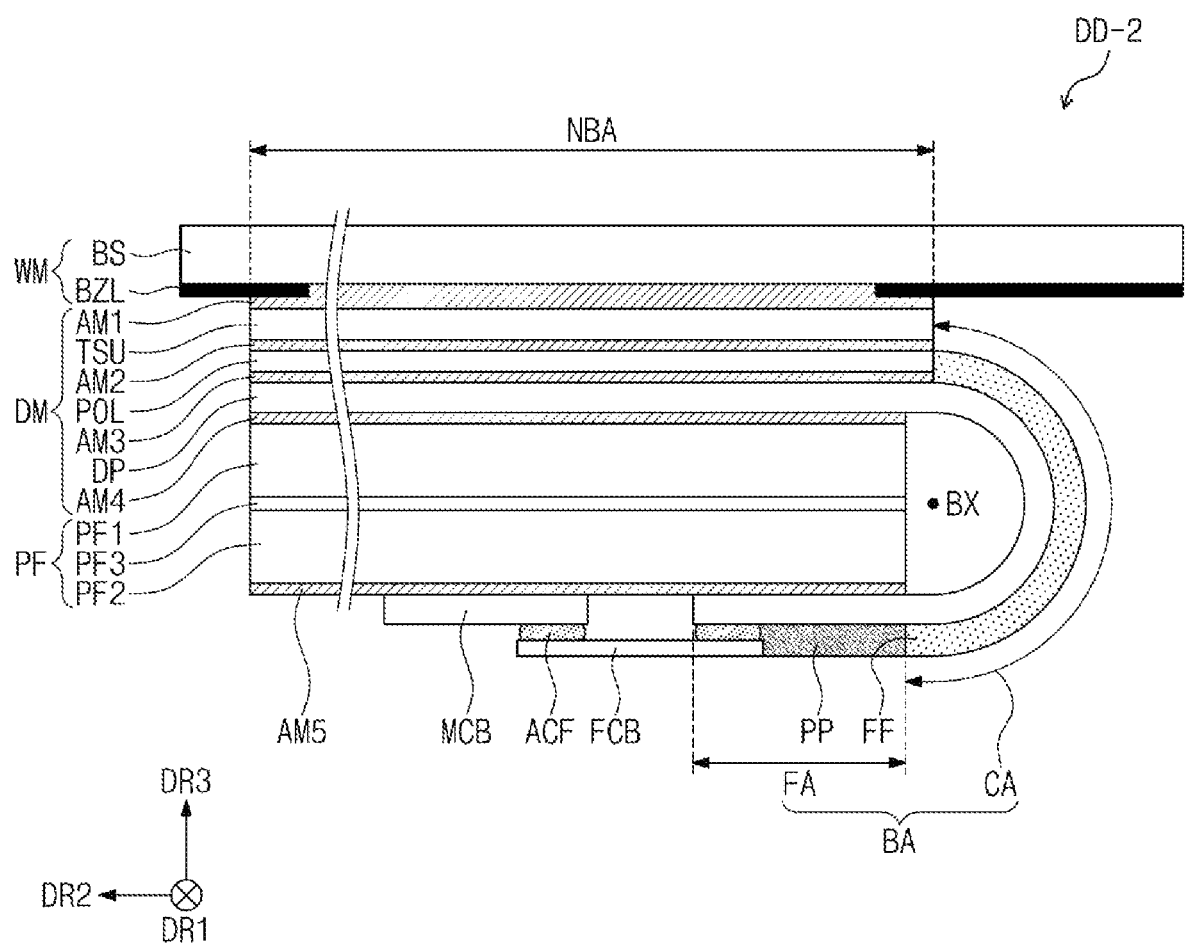
FIG. 4B is a cross-sectional view of a display apparatus in a bent state according to an exemplary embodiment of the present invention.

FIG. 4A is a cross-sectional view of a display apparatus according to an exemplary embodiment of the present invention. FIG. 4B is a cross-sectional view of a display apparatus in a bent state according to an exemplary embodiment of the present invention. FIG. 5 is an enlarged view of region AA' of FIG. 4A according to an exemplary embodiment of the present invention. The same reference numerals may be used for the same configurations as those in FIG. 1 and FIG. 2, and redundant descriptions may be omitted.

According to an exemplary embodiment of the present invention, as shown in FIG. 4A, a display apparatus DD-1 may be substantially flat in a first mode. The first mode corresponds to a predetermined section of the display apparatus DD-1 and may be a state in which the display apparatus DD-1 is substantially flat.

According to an exemplary embodiment of the present invention, as shown in FIG. 4B, a display apparatus DD-2 may have a bent (or, e,g., curved) shape in a second mode. The second mode may be a state in which the display apparatus DD-2 is bent at a predetermined section of the display apparatus DD-2. The display apparatuses DD-1 and DD-2 according to the present invention may include a plurality of regions that perform different functions, such as bending and not bending.

The display panel DP includes the bending region BA that is bendable with respect to a bending axis BX and a non-bending region NBA that is not bendable.

The bending region BA includes a curvature region CA and a facing region FA arranged along the second direction DR2. The curvature region CA may be a region that is bendable about the bending axis BX. As shown in FIG. 4B, in the second mode, the facing region FA may overlap the non-bending region NBA. For example, the facing region FA may overlap the non-bending region NBA in the third direction DR3.

The non-bending region NBA is connected to the bending region BA and may be spaced apart from the facing region FA with the curvature region CA disposed between the facing region FA and the non-bending region NBA. The input sensing unit ISU, the anti-reflection member POL, and the protective member PF according to an exemplary embodiment of the present invention may be disposed on the non-bending region NBA.

The non-bending region NBA, according to an exemplary embodiment of the present invention, overlaps the transmissive region TA and the pixel region PXA. However, the present invention is not limited thereto. For example, the bending region BA may overlap the transmissive region TA and the pixel region PXA, but present invention is not limited thereto.

In an exemplary embodiment of the present invention, the display apparatus DD-1 may include a plurality of bending regions BA. In addition, the bending region BA may correspond to a manner in which the display apparatus DD-1 is operated by a user. For example, the bending region BA may extend parallel to the second direction DR2, or may extend in a diagonal direction between the first direction DR1 and the second direction DR2 unlike in FIG. 4A and FIG. 4B. The area of the bending region BA may not be fixed but may be determined according to a radius of curvature of the bending region BA.

Referring to FIG. 4A, the display apparatus DD-1 in a first state is shown. In the display apparatus DD-1 according to an exemplary embodiment of the present invention, the window member WM and the display module DM may be bonded to each other by an adhesive layer AM1. In addition, each layer of the display module DM may be bonded to each other by adhesive layers AM2 and AM3. Further, the display module DM and the protective member PF may be physically coupled to each other by an adhesive layer AM4. For example, an adhesive layer may be a pressure sensitive adhesive (PSA), an optical clear adhesive (OCA), or an optical clear resin (OCR). In addition, the adhesive layer may include a photo-curable adhesive material or a thermosetting adhesive material, but the present invention is not limited thereto.

The protective member PF according to an exemplary embodiment of the present invention may include a first protective layer PF1 (hereinafter, a support layer), a second protective layer PF2 (hereinafter, an impact absorbing layer), and a third protective layer PF3 (hereinafter, a light blocking layer) disposed between the support layer PH and the impact absorbing layer PF2. At least one of the support layer PF 1, the impact absorbing layer PF2 or the light blocking layer PF3 may be omitted. In addition, the stacking order thereof, to be arranged along the third direction DR3, may be changed, but the present invention is not limited thereto.

The support layer PF1 may include a thermoplastic resin, for example, a plastic film including one of consisting of polyethylene terephthalate (PET), polyethylene (PE), polyvinylchloride (PVC), polypropylene (PP), polystyrene (PS), polyacrylonitrile (PAN), styrene-acrylonitrile copolymer (SAN), acrylonitrile-butadiene-styrene (ABS), polymethyl methacrylate (PMMA), or a combination thereof. For example, by using polyethyeleneterepthalate (PET), the support layer PF1 of the present invention may have a high fatigue strength, increased electrical properties, a high heat resistance and may be less affected by temperature and humidity.

The impact absorbing layer PF2 may be a synthetic resin foam. The impact absorbing layer PF2 may be provided as a matrix layer including a plurality of pores. The matrix layer may include a synthetic resin. For example, the matrix layer may include at least one of acrylonitrile butadiene styrene copolymer (ABS), polyurethane (PU), polyethylene (PE), ethylene vinyl acetate (EVA) or polyvinyl chloride (PVC). As the plurality of pores forms a porous structure, an external impact applied to the display apparatus DD may be absorbed.

The light blocking layer PF3 may prevent elements, configurations, circuits or layers that are disposed on a rear surface of the display panel DP from being reflected through the transmissive region TA. The light blocking layer PF3 may block light emitted from the rear surface of the display panel DP.

In addition, the second protective layer PF2 may further include a heat dissipating layer. The heat dissipating layer may dissipate heat generated from the display panel DP. The heat dissipating layer may include at least one of graphite, copper (Cu), or aluminum (Al) which have heat dissipating properties, but the present invention is not limited thereto. The heat dissipating layer not only increases heat dissipating properties but may also have electromagnetic wave shielding or electromagnetic wave absorbing properties.

The display apparatus DD according to an exemplary embodiment of the present invention may have increased impact resistance and light shielding by including the protective member PF disposed on a lower portion of the display panel DR In addition, the electronic device ED having increased visibility together with. increased resistance against an external impact or stress, which are generated during use of the electronic device ED, may be provided.

According to an exemplary embodiment of the present invention, the stress relief member FF may be disposed in the curvature region CA, and the adhesive member PP may be disposed in the facing region FA. However, the present invention is not limited thereto. For example, a portion of the stress relief member FF may overlap the facing region FA.

Referring to FIG. 4B, the main circuit board MCB, the flexible circuit board FCB, and an anisotropic conductive film ACF which are disposed in the facing region FA may overlap the non-bending region NBA on a plane in the second mode. In the second mode, the facing region FA of the display panel DP and the main circuit board MCB may be coupled to a fifth adhesive layer AMS disposed on a lower portion of the second protective layer PF2.

The display apparatus DD-2 according to an exemplary embodiment of the present invention may absorb an impact applied from the outside by including the protective member PF disposed in-between the curvature region CA and an edge of the display apparatus DD-2 in the second mode, and may reduce stress applied to the curvature region CA by supporting a space of the display panel DP, for example, the space formed around the bending axis BX.

According to an exemplary embodiment of the present invention, the adhesive member PP disposed in the facing region FA has a higher modulus of elasticity than that of the stress relief member FF disposed in the curvature region CA. For example, the adhesive member PP may have a modulus of elasticity of about 70 MPa to about 100 MPa.

The stress relief member FF may have a modulus of elasticity from about 2000 MPa to about 300 MPa. Accordingly, by alleviating the stress applied to the curvature region. CA, during bending, through the stress relief member FF, configurations of the display panel DP such as signal lines, which are disposed in the curvature region CA, may be protected.

Figure 5A:
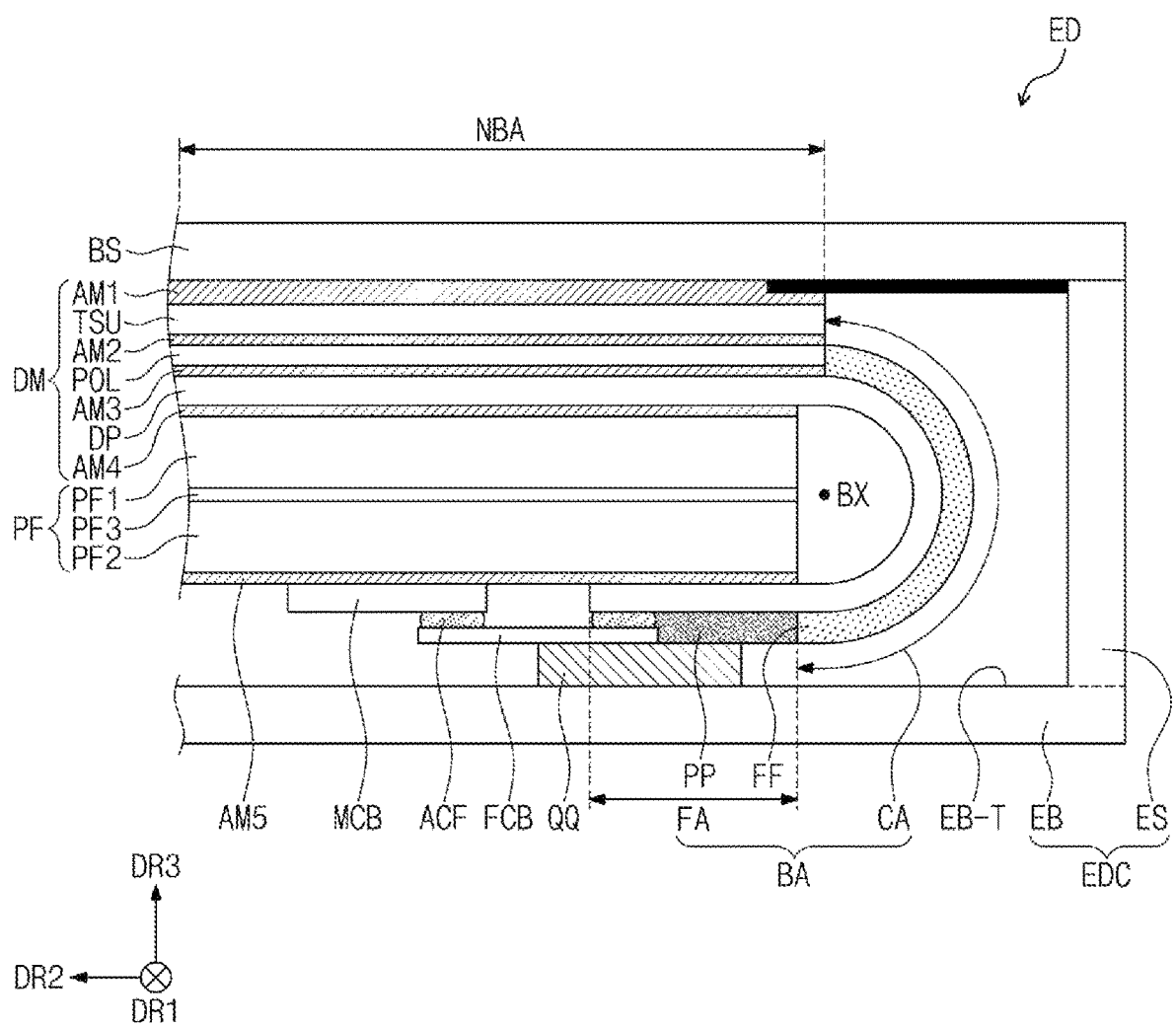
FIG. 5A is a cross-sectional view of an electronic device according to an exemplary embodiment of the present invention.
Figure 5B:
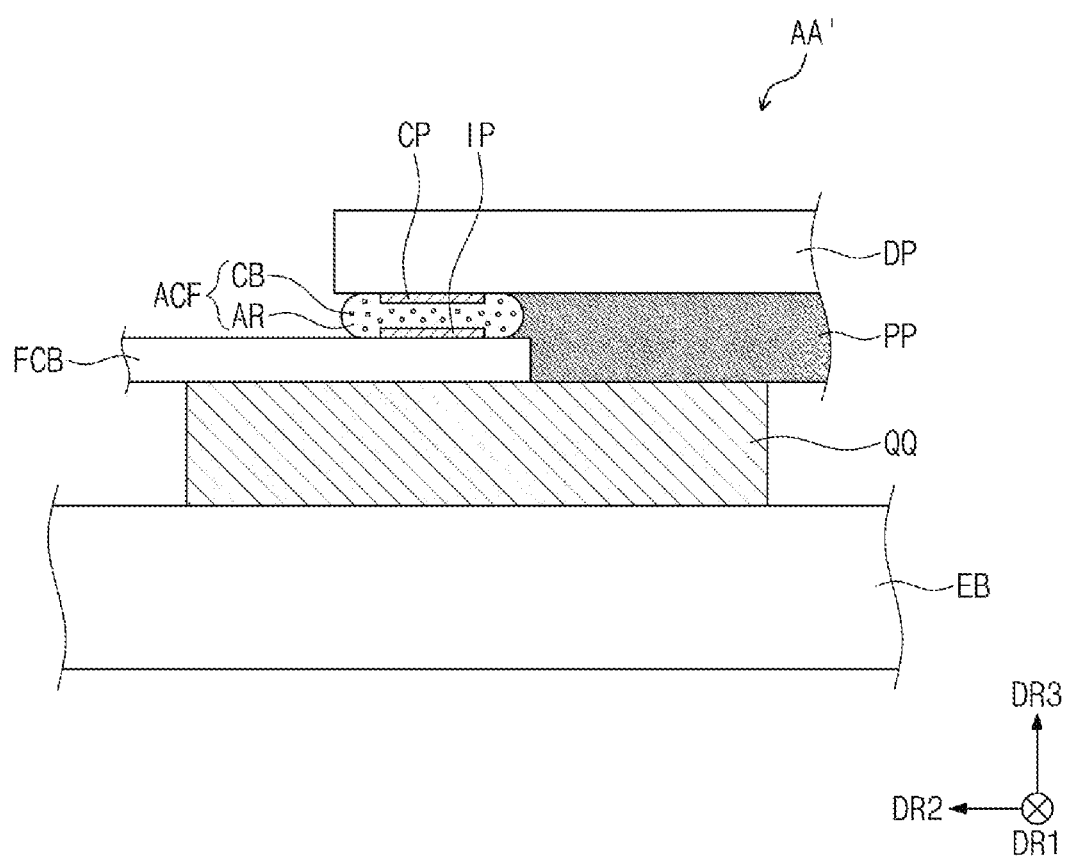
FIG. 5B is an enlarged view of region AA' of FIG. 4A according to an exemplary embodiment of the present invention.

FIG. 5A is a cross-sectional view of an electronic device according to an exemplary embodiment of the present invention. FIG. 5B is an enlarged view of region AA' of FIG. 4A according to an exemplary embodiment of the present invention, The same reference numerals may be used for the same configurations as those in FIG. 1 to FIG. 4B, and redundant descriptions may be omitted.

FIG. 5A shows the electronic device ED of the display apparatus DD-2 in the second mode shown in FIG. 4B, which is coupled to the window member WM. The housing member EDC coupled to the window member WM includes a bottom portion EB and a connection portion ES which is bent in the third direction DR3 from the bottom portion EB. The bottom portion EB includes a bottom surface EB-T facing the window member WM. An end of the connection portion ES is coupled to the window member WM to accommodate the display module DM and the protective member PF.

The electronic device ED according to an exemplary embodiment of the present invention further includes an additional adhesive member QQ, The additional adhesive member QQ is disposed on the bottom surface EB-T. The additional adhesive member QQ is coupled to the flexible circuit board FCB. In addition, the additional adhesive member QQ may be coupled to at least a portion of the adhesive member PP. In FIG. 5A, the additional adhesive member QQ is shown to cover a portion of the adhesive member PP, but the present invention is not limited thereto. For example, additional adhesive member QQ may cover the entire surface of the adhesive member PP.

The electronic device ED according to an exemplary embodiment of the present invention may increase impact resistance by coupling the adhesive member PP and the flexible circuit board FCB to the housing member EDC through the additional adhesive member QQ. In addition, the adhesive member PP disposed in the facing region FA has a higher modulus of elasticity than that of the stress relief member FF disposed in the curvature region CA, thereby having relatively high impact resistance by coupling the adhesive member PP to the additional adhesive member QQ rather than coupling the single stress relief member FF to the additional adhesive member QQ. Accordingly, the electronic device ED with an increased impact resistance may be provided.

FIG, 5B is an enlarged view of the display panel DP and the flexible circuit board FCB which are coupled to each other. The display panel DP includes a first pad CP connected to the pixel PX. The flexible circuit board FCB includes a second pad IP overlapping the first pad CP on a plane.

The display apparatus DD according to an exemplary embodiment of the present invention further includes the anisotropic conductive film ACE for connecting the first pad CP and the second pad ID. The anisotropic conductive film ACF may include an adhesive resin AR and a plurality of conductive balls CB dispersed in the adhesive resin AR. The adhesive resin AR fixes the plurality of conductive balls CB within a predetermined region of the adhesive resin AR and physically couples the display panel DP and the flexible circuit board FCB to each other. The plurality of conductive balls CB electrically connects the display panel DP and the flexible circuit board FCB to each other. In addition, the connection between the main circuit board MCB and the flexible circuit board FCB may be achieved through the anisotropic conductive film ACE disposed between the pads of the main circuit board MCB and the flexible circuit board FCB.

An end of the anisotropic conductive film ACF and an end of the flexible circuit board FCB according to an exemplary embodiment of the present invention may be covered by the adhesive member PP. Accordingly, delamination of the anisotropic conductive film ACF and the flexible circuit board FCB may be prevented through the adhesive member PP.

FIG. 6A to FIG. 6D are cross-sectional views of a display apparatus according to an exemplary embodiment of the present invention. FIG. 6A to FIG. 6D are examples of coupling relationship of an adhesive member, an anisotropic conductive film, a flexible circuit board, and an additional adhesive member. For convenience of explanation, the pads IP and CP shown in FIG. 5B are omitted.

Figure 6A:
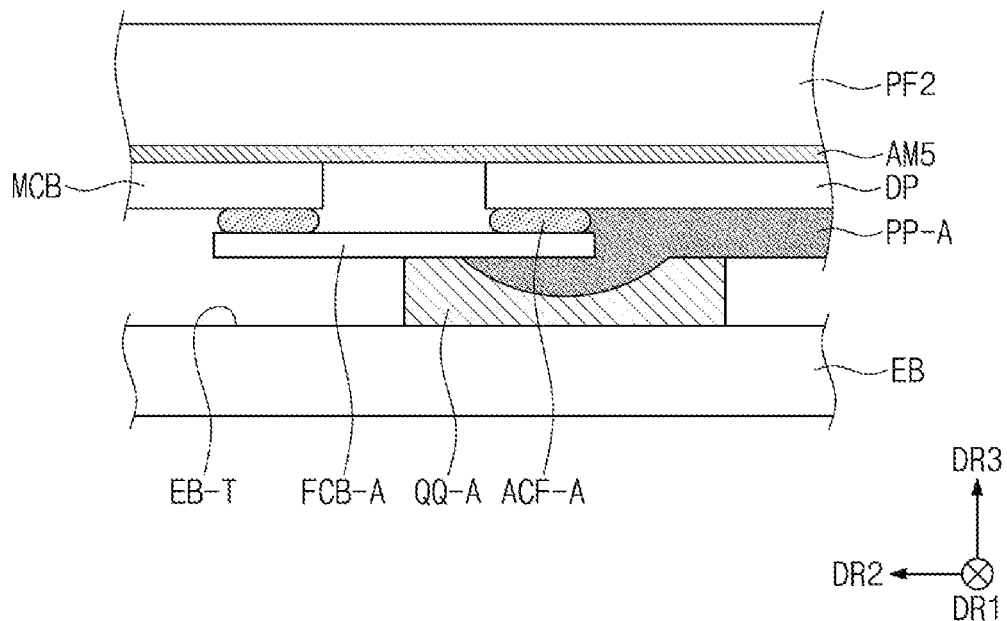
FIG. 6A, 6B, 6C and 6D are cross-sectional views of a display apparatus according to an exemplary embodiment of the present invention.

Referring to FIG. 6A, an adhesive member PP-A according to an exemplary embodiment of the present invention may cover a portion of a flexible circuit board FCB-A. For example, the adhesive member PP-A may be in contact with a portion of an upper surface of the flexible circuit board FCB-A and an end of the flexible circuit board FCB-A bent from the upper surface of the display panel DP. For example, the adhesive member PP-A may be disposed on a surface of the flexible circuit hoard FCB-A that faces the bottom portion EB.

The adhesive member PP-A shown in FIG. 6A may overlap an anisotropic conductive film ACF-A on a plane unlike the adhesive member PP shown in FIG. 4A. As the adhesive member PP-A covers a portion of the anisotropic conductive film ACF-A, depending on the shape of the formed adhesive member PP-A, the shape of an additional adhesive member QQ-A disposed on the bottom surface EB-T may be provided in various forms.

Figure 6B:
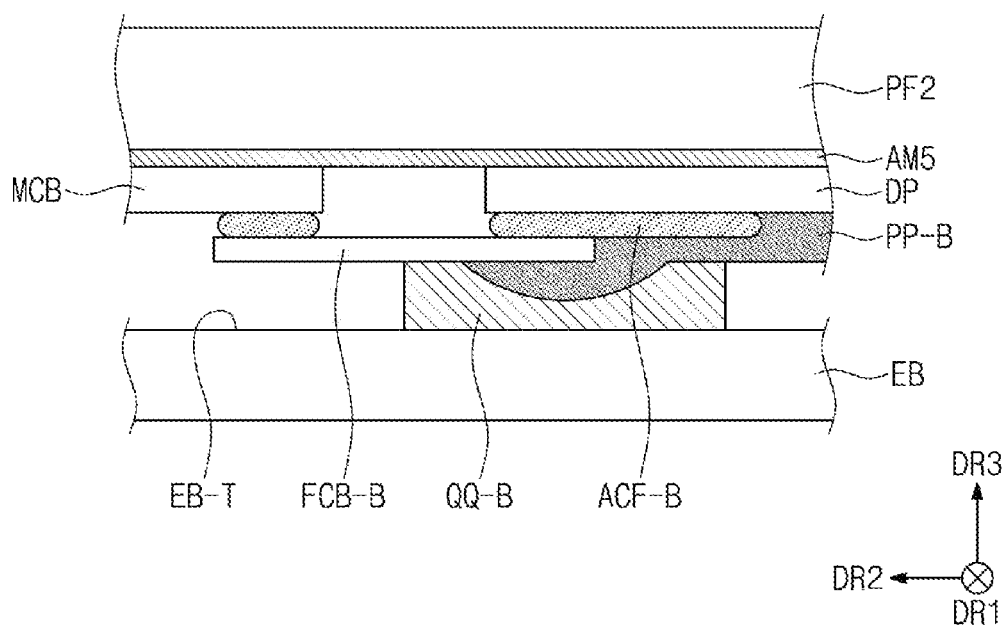

Referring to FIG. 6B, an anisotropic conductive film ACF-B may extend along the second direction DR2 to have a shape protruding beyond an edge of a flexible circuit board FCB-B. A protruding portion of the anisotropic conductive film ACF-B may be covered by an adhesive member PP-B.

As the adhesive members PP-A and PP-B, according to an exemplary embodiment of the present invention, cover a portion of the flexible circuit board FCB-B, an electronic device with increased impact resistance may be provided, In addition, as the protruded anisotropic conductive film ACF-B is in contact with the adhesive member PP-B, coupling force between the display panel DP and the flexible circuit board FCB-B may be increased.

In an exemplary embodiment of the present invention, the anisotropic conductive film AFC-B may extend into the curvature region CA from the facing region FA, and the anisotropic conductive film AFC-B may be covered by the adhesive member PP-B.

Figure 6C:
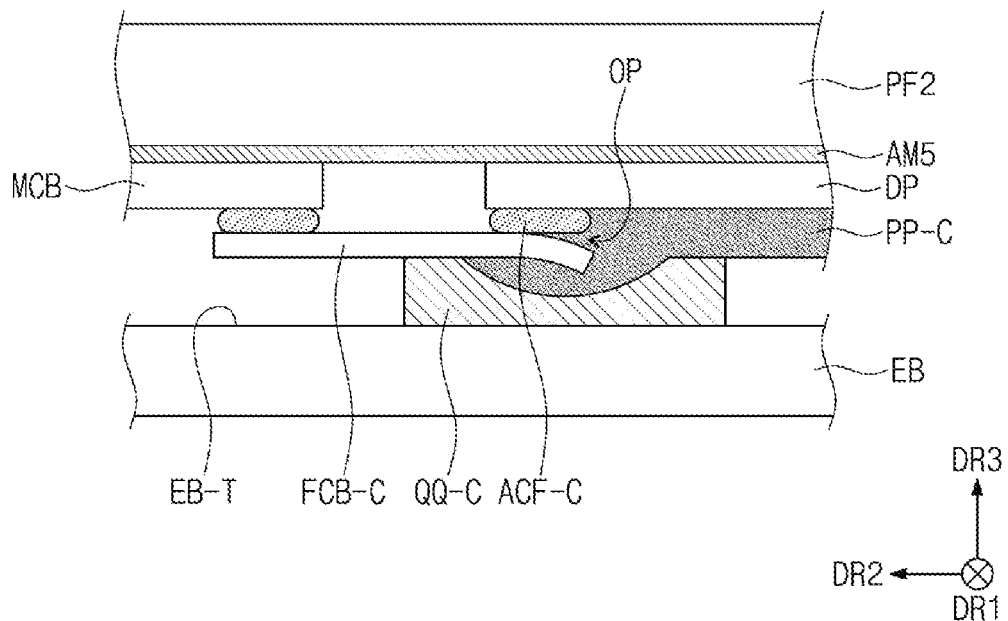

Referring to FIG. 6C, unlike FIG. 6A, an adhesive member PP-C according to an exemplary embodiment of the present invention may cover a portion of a flexible circuit board FCB-C. During a process of bending the display panel DP, the flexible circuit board FCB-C and an anisotropic conductive film ACF-C may be separated so that a space OP may be formed. The space OP generated during the process of bending may be filled with the adhesive member PP-C.

Figure 6D:
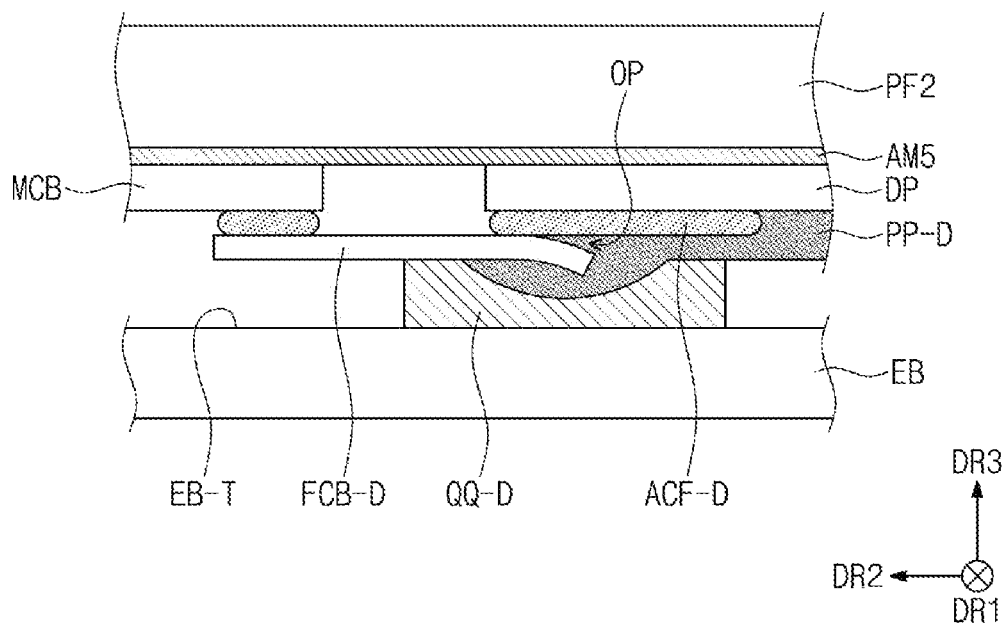

Referring to FIG. 6D, an anisotropic conductive film ACF-D may be extended along the second direction DR2 to have a shape protruding beyond an edge of a flexible circuit board FCB-D. During a process of bending the display panel DP, a flexible circuit board FCB-D and an anisotropic conductive film ACF-D may be separated from each other so that a space OP may be formed therebetween. The space OP generated during the process of bending may be filled with an adhesive member PP-D.

According to an exemplary embodiment of the present invention, the spaces OP generated by the separation of the flexible circuit boards FCB-C and FCB-D and the anisotropic conductive films ACF-C and ACF-D are filled with the adhesive members PP-C and PP-D so that impurities introduced from the outside may be blocked. Accordingly, an electronic device with increased structural strength may be provided.

Figure 7:
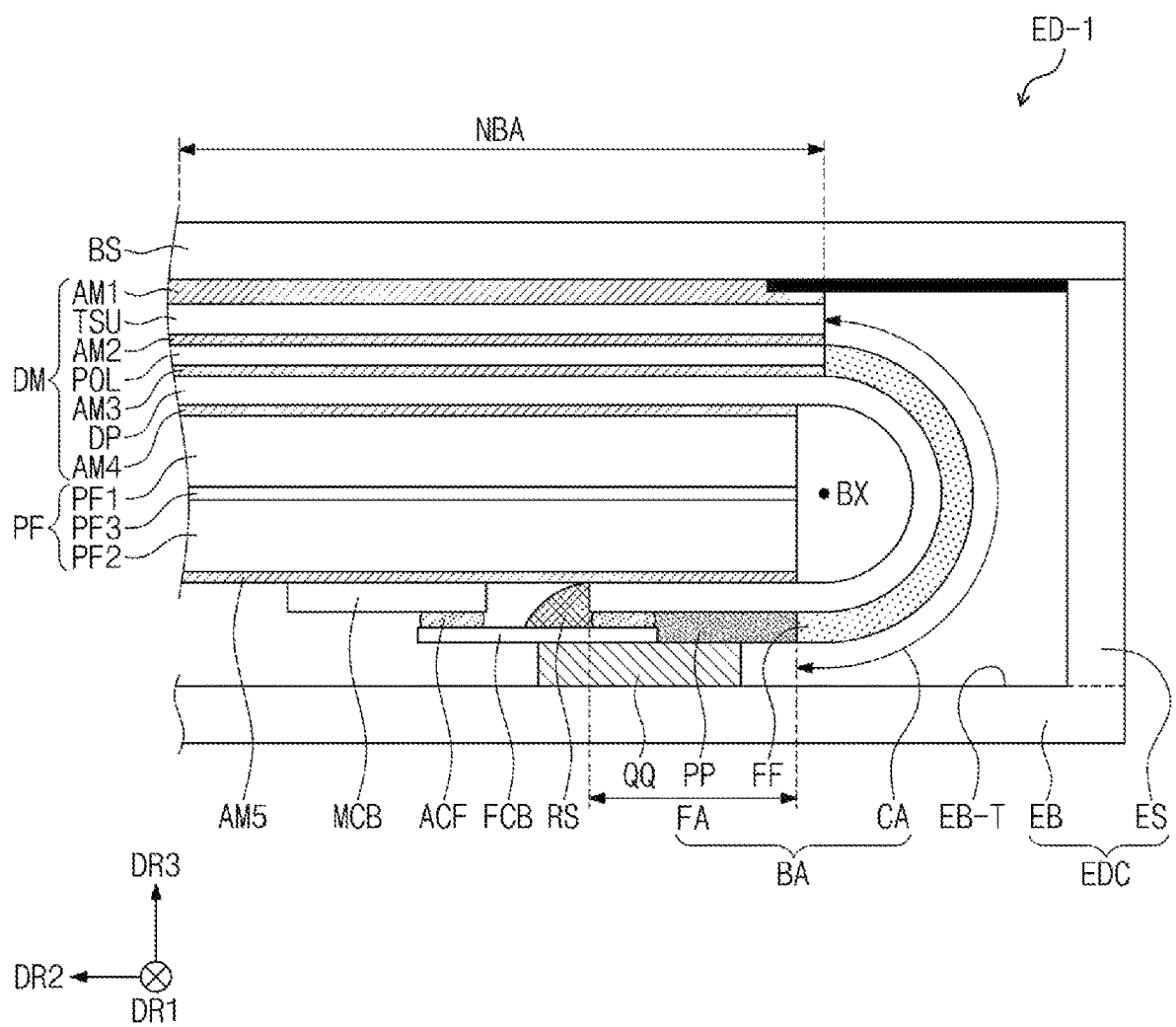
FIG. 7 is a cross-sectional view of a display apparatus in a bent state according to an exemplary embodiment of the present invention.

FIG. 7 is a cross-sectional view of a display apparatus in a bent state according to an exemplary embodiment of the present invention. The same reference numerals may be used for the same configurations as those in FIG. 1 to FIG. 5A, and redundant descriptions may be omitted.

Referring to FIG. 7, an electronic device ED-1, according to an exemplary embodiment of the present invention, further includes an additional protective member RS. The additional protective member RS seals an end of the display panel DP in the second mode. For example, the additional protective member RS may be disposed between an end of the facing region FA and the main circuit board MCB, and may be disposed on the flexible circuit board. FCB. For example, the additional protective member RS may seal an end of the facing region FA. The additional protective member RS may be in contact with an end of the anisotropic conductive film ACF. The additional protective member RS may include a thermosetting material or a photo-curable material. In FIG. 7, the additional protective member RS that seals between the end of the display panel DP and the flexible circuit board FCB is shown, but the present invention is not limited thereto. For example, the additional protective member RS may fill a space provided by the main circuit board MCB, the flexible circuit board FCB, the display panel DP, and the fifth adhesive layer AM5. The electronic device ED-1 according to an exemplary embodiment of the present invention may block oxygen and moisture from being introduced to the display panel DP from the outside by including the additional protective member RS. in addition, a coupling force between the display panel DP and the flexible circuit board FCB may be increased.

A display apparatus according to an exemplary embodiment of the present invention may prevent delamination between configurations and/or layers disposed in a bending region by disposing an adhesive member and an additional adhesive member having different moduli of elasticity from each other's in the bending region. In addition, as an adhesive member disposed in a housing member is in contact with. the adhesive member of the display apparatus, an electronic device with increased impact strength may be provided.

While the present invention has been particularly shown and described with reference to exemplary embodiments thereof, it will be apparent to those of ordinary skill in the art that various changes in form and detail may be made thereto without departing from the spirit and scope of the present invention as defined by the following claims.

What is claimed is:

1. A display apparatus, comprising:
a display panel including:
a base substrate with an upper surface and a rear surface;
a first pad disposed on the upper surface;
a bending region having a curvature region and a facing region adjacent to the curvature region, wherein the curvature region is bendable about a bending axis extended along a first direction; and
a non-bending region adjacent to the bending region and spaced apart from the facing region, wherein the curvature region is disposed between the facing region and the non-bending region;
a first protective member disposed in the non-bending region and on the rear surface of the base substrate;
a flexible circuit board including a second pad connected to the first pad of the display panel in the facing region;
a stress relief member disposed in the curvature region and on the upper surface of the base substrate; and
an adhesive member disposed in the facing region and on the upper surface of the base substrate, wherein the adhesive member has a higher modulus of elasticity than that of the stress relief member and is coupled to the flexible circuit board.

2. The display apparatus of claim 1, wherein, when the display panel is bent about the bending axis, the facing region overlaps the non-bending region, and the facing region of the display panel is coupled to the first protective member.

3. The display apparatus of claim 2, further comprising second protective member disposed in the non-bending region, wherein the second protective member seals an end of the display panel and is disposed on the flexible circuit board.

4. The display apparatus of claim 1, further comprising an anisotropic conductive film disposed between the first pad and the second pad and connecting the first pad and the second pad.

5. The display apparatus of claim 4, wherein the anisotropic conductive film extends toward the curvature region from the facing region, and is covered by the adhesive member.

6. The display apparatus of claim 4, wherein a portion of the flexible circuit board is separated from the anisotropic conductive film, and the adhesive member is disposed between the portion of the flexible circuit hoard and the anisotropic conductive film.

7. The display apparatus of claim 4, wherein the adhesive member exposes an upper surface of the flexible circuit board and is in contact with an end of the flexible circuit board, wherein the flexible circuit board is bent from the upper surface of the base substrate.

8. The display apparatus of claim 4, wherein the adhesive member is in contact with a portion of the upper surface of the flexible circuit board and an end of the flexible circuit board, wherein the flexible circuit board is bent from the upper surface of the base substrate.

9. The display apparatus of claim 1, wherein the first protective member comprises a support layer, an impact absorbing layer, a heat dissipating layer or a light blocking layer.

10. The display apparatus of claim 1, further comprising an anti-reflection member disposed on the display panel.

11. An electronic device, comprising:
a window member including a transmissive region, and a bezel region adjacent to the transmissive region;
a display panel including:
pixels disposed under the window member and displaying an image in the transmissive region;
a first pad connected to the pixels;
a bending region including a curvature region and a facing region connected to the curvature region, wherein the curvature region is bendable about a bending axis extended along a first direction; and
a non-bending region connected to the bending region and facing the facing region;
a flexible circuit hoard including a second pad connected to the first pad;
a housing member including a bottom portion having a first surface and a connecting portion bent from the bottom portion, wherein the housing member accommodates the display panel and the flexible circuit board, when coupled to the window member;
a stress relief member disposed in the curvature region;
a first adhesive member disposed in the facing region and coupled to the flexible circuit board; and
a second adhesive member disposed on the first surface of the bottom portion and coupled to the housing member and the flexible circuit board, wherein
the second adhesive member is coupled to a portion of the first adhesive member.

12. The electronic device of claim 11, wherein a modulus of elasticity of the first adhesive member is higher than that of the stress relief member.

13. The electronic device of claim 11, further comprising an anisotropic conductive film disposed between the first pad and the second pad and connecting the first pad and the second pad.

14. The electronic device of claim 13, wherein
the anisotropic conductive film extends toward the curvature region from the facing region and is covered by the first adhesive member, and the second adhesive member overlaps a portion of the anisotropic conductive film.

15. The electronic device of claim 14, further comprising a space between a portion. of the flexible circuit board and the anisotropic conductive film, wherein the space is filled with the first adhesive member.

16. The electronic device of claim 15, wherein the first adhesive member is in contact with an end of the flexible circuit board and an end of the anisotropic conductive film.

17. The electronic device of claim 11, wherein the pixels comprise organic light emitting devices.

18. The electronic device of claim 11, further comprising a protective member disposed on a lower portion of the display panel and disposed in the non-bending region, wherein
the protective member includes a support layer, an impact absorbing layer, a heat dissipating layer or a light blocking layer.

19. The electronic device of claim 11, further comprising an input sensing unit disposed on the display panel and an anti-reflection member disposed on the input sensing unit.

20. The electronic device of claim 11, wherein the stress relief member comprises a heat curable material or a light curable material.

21. A display apparatus, comprising:
- a display panel including a non-bending region and a bending region including a curvature region and a facing region adjacent to the curvature region, wherein the curvature region is disposed between the non-bending region and the facing region;
- a protective member disposed on the display panel and in the non-bending region;
- a stress relief member disposed on the display panel and in the curvature region;
- a flexible circuit board electrically connected to the display panel in the facing region; and
- an adhesive member disposed on the display panel, in the facing region, and including a first end and a second end opposite the first end, wherein the first end touches an end of the stress relief member and the second end touches an end of the flexible circuit board in the facing region.

* * * * *